United States Patent [19]
Gardner et al.

[11] Patent Number: 5,789,298
[45] Date of Patent: Aug. 4, 1998

[54] HIGH PERFORMANCE MOSFET STRUCTURE HAVING ASYMMETRICAL SPACER FORMATION AND METHOD OF MAKING THE SAME

[75] Inventors: Mark I. Gardner, Cedar Creek; Fred Hause, Austin, both of Tex.

[73] Assignee: Advanced Micro Devices, Inc., Sunnyvale, Calif.

[21] Appl. No.: 743,643

[22] Filed: Nov. 4, 1996

[51] Int. Cl.$^6$ ................. H01L 21/336; H01L 21/3205; H01L 21/4763
[52] U.S. Cl. ................. 438/286; 438/303; 438/305; 438/592
[58] Field of Search ................. 438/286, 303, 438/305, 592, 175, 190

[56] References Cited

U.S. PATENT DOCUMENTS

| | | |
|---|---|---|
| 5,364,807 | 11/1994 | Hwang . |
| 5,547,885 | 8/1996 | Ogoh ................. 438/286 |
| 5,627,807 | 5/1997 | Hsu . |
| 5,648,286 | 7/1997 | Gardner et al. . |
| 5,654,215 | 8/1997 | Gardner et al. ................. 438/286 |
| 5,656,518 | 8/1997 | Gardner et al. ................. 438/286 |

OTHER PUBLICATIONS

"An Asymmetric Sidewall Process for High Performance LDD MOSFET's," *IEEE Transactions on Electron Devices*, vol. 41, No. 2, PP. 186–189, Feb. 1994.

Primary Examiner—John Niebling
Assistant Examiner—Richard A. Booth
Attorney, Agent, or Firm—Jenkens & Gilchrist; Michael J. Balconi-Lamica; Paul S. Drake

[57] ABSTRACT

A method of fabricating a field effect transistor (FET) having an asymmetrical spacer formation includes the steps of forming a gate oxide and a gate electrode on a semiconductor material of a first conductivity type. The gate electrode includes a first and second side edges proximate first and second regions, respectively, of the semiconductor material. Ions of a second conductivity type are implanted to form lightly doped regions extending at least between the first side edge and the first region and at least between the second side edge and the second region, respectively. Blanket layers of oxide and nitride are then formed on the gate electrode and the semiconductor material. The nitride layer is patterned and a first sidewall spacer is formed in a remaining portion of the nitride layer proximate the second side edge. A second blanket layer of oxide is then formed on the first oxide layer and first sidewall spacer. Lastly, second sidewall spacers are formed in the second oxide layer, wherein a first one of the second sidewall spacers includes oxide of a first lateral dimension proximate the first side edge and wherein a second one of the second sidewall spacers is juxtaposed with the first sidewall spacer to form a composite sidewall spacer of a second lateral dimension greater than the first lateral dimension. A novel FET is disclosed also.

10 Claims, 3 Drawing Sheets

HIGH PERFORMANCE MOSFET STRUCTURE HAVING ASYMMETRICAL SPACER FORMATION AND METHOD OF MAKING THE SAME

CROSS-REFERENCE TO COPENDING APPLICATION

Copending U.S. patent application 08/743,522, filed on even date herewith, entitled "High Performance Asymmetrical MOSFET Structure and Method of Making the Same" and assigned to the assignee of the present invention describes a related high performance MOSFET structure and is incorporated herein by reference.

BACKGROUND OF THE INVENTION

1. Field of the Invention

This invention relates generally to field effect transistor structures and, more particularly, to high performance MOSFET structures and a method for making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents an MOS transistor or MOSFET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include n$^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{Gx}$) from the voltage at the drain ($V_{GS}$-$V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

Referring briefly to one aspect in the fabrication of FET device structures, low series resistance is often achieved by siliciding (i.e., forming a metal silicide at a metal-silicon interface) of the source and drain or selectively depositing metal such as titanium or cobalt on the source and drain areas. However, silicidation consumes surface silicon and can give rise to increased leakage current.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

Microprocessor circuits utilize FET device structures, including, for example, inverter circuits. In an effort increase performance and to increase the speed of a microprocessor circuit, the drive current of the transistor device structures incorporated therein must be increased. Typically, if the circuit is tuned for the transistor, then the faster one makes the transistor, the faster the speed of the circuit. The speed of the transistor is directly correlated with the drive current of the FET, referred to as $I_{DSAT}$. $I_{DSAT}$ is the amount of current which can be flowed through the transistor when the transistor is fully turned on. As the drive current increases, the speed of the transistor increases. Simply increasing the speed of the transistor, however, may not be sufficient. That is, while the speed of the transistor depends upon the raw drive current, if the transistor lacks reliability, then the overall circuit reliability suffers.

In further discussion of an FET device, FIG. 1 shows a conventional transistor having a gate G, source S, and drain D. The transistor further includes parasitic resistances of the lightly doped drain (LDD) regions in the source and drain, corresponding to $R_S$ and $R_D$, respectively. A bias voltage Vdd is applied to the drain and the source is connected to ground potential. A voltage drop exists across the parasitic resistance $R_D$, such that the drain sees some voltage less than Vdd (i.e., the voltage which appears at the drain is less than Vdd). Similarly, the voltage drop across parasitic resistance $R_S$ causes the source to see some voltage more than zero (i.e., the voltage which appears at the source is more than ground potential).

As far as the transistor is concerned, when the transistor is on, its drive current($I_{DSAT}$) depends primarily upon $V_{GS}$. The relationship between $I_{DSAT}$ and $V_{GS}$ is given by the expression $I_{DSAT}=K/2\times(V_{GS}-V_T)^2$, where K is a constant which contains a number of process parameters integrated together, and $V_T$ is the threshold voltage. $V_{DS}$ is not an included term in the simplified equation since $V_{DS}$ is more of a secondary effect. In addition, parasitic resistance $R_D$ is also a secondary effect. Reducing or eliminating $R_S$ therefore pulls the source voltage closer to ground, and increases the effective $V_{GS}$. From the equation above, it can be seen that increasing $V_{GS}$ directly increases $I_{DSAT}$.

Furthermore, while it would appear desirable from a drive current point of view to decrease $R_D$ as well, a hot carrier injection control must be maintained. The lightly doped region on the drain side of the transistor is thus necessary. HCI control is a reliability parameter of the transistor. It would thus be desirable to increase the transistor performance, but not at the expense of device reliability.

SUMMARY OF THE INVENTION

It is an object of the present invention to increase the performance of a MOS FET device, while maintaining a high device reliability.

In accordance with the present invention, a method of fabricating a field effect transistor (FET) having an asymmetrical spacer formation includes the following steps. A gate oxide and a gate electrode are formed on a semiconductor material of a first conductivity type, the gate electrode having a first side edge proximate a first region of the semiconductor material and a second side edge proximate a second region of the semiconductor material. Ions of a second conductivity type are implanted in regions of the semiconductor material not covered by the gate oxide for forming first and second lightly doped regions, the first and second lightly doped regions extending at least between the first side edge and the first region and at least between the second side edge and the second region, respectively. A first blanket layer of oxide is then formed on the gate electrode and layer of semiconductor material. A blanket layer of nitride is formed on the first oxide layer. Thereafter, the nitride layer is patterned to remove the nitride layer except at a third region extending over the second side edge of the gate electrode and a portion of the semiconductor material proximate the second side edge. A remaining portion of the nitride layer overlayes the second side edge and is separated from the gate electrode and semiconductor material by the first oxide layer. A first sidewall spacer is then formed in the remaining portion of the nitride layer proximate the second side edge. A second blanket layer of oxide is formed on the first oxide layer and the first sidewall spacer. Lastly, second sidewall spacers are formed in the second oxide layer, wherein a first one of the second sidewall spacers includes oxide of a first lateral dimension "L1" proximate the first side edge and wherein a second one of the second sidewall spacers is juxtaposed with the first sidewall spacer to form a composite sidewall spacer of a second lateral dimension "L2" greater than the first lateral dimension.

In addition, in accordance with the present invention, a field effect transistor (FET) device having an asymmetrical spacer formation includes a gate oxide and a gate electrode formed on a semiconductor material of a first conductivity type, the gate electrode having a first and second side edges proximate a first and a second region of the semiconductor material, respectively. First and second lightly doped regions of a second conductivity type are formed in regions of the semiconductor material not covered by the gate oxide, wherein the first and second lightly doped regions extend at least between the first side edge and the first region and at least between the second side edge and the second region, respectively. A first blanket layer of oxide is formed on the gate electrode and semiconductor material. A first sidewall spacer of nitride is formed proximate the second side edge of the gate electrode. Lastly, second sidewall spacers are formed, wherein a first one of the second sidewall spacers includes oxide of a first lateral dimension proximate the first side edge and wherein a second one of the second sidewall spacers is juxtaposed with the first sidewall spacer to form a composite sidewall spacer of a second lateral dimension greater than the first lateral dimension.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
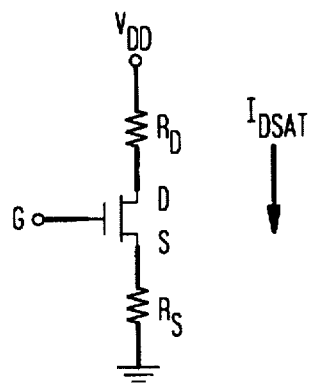
FIG. 1 illustrates a circuit diagram representation of an FET device.
Figure 2:
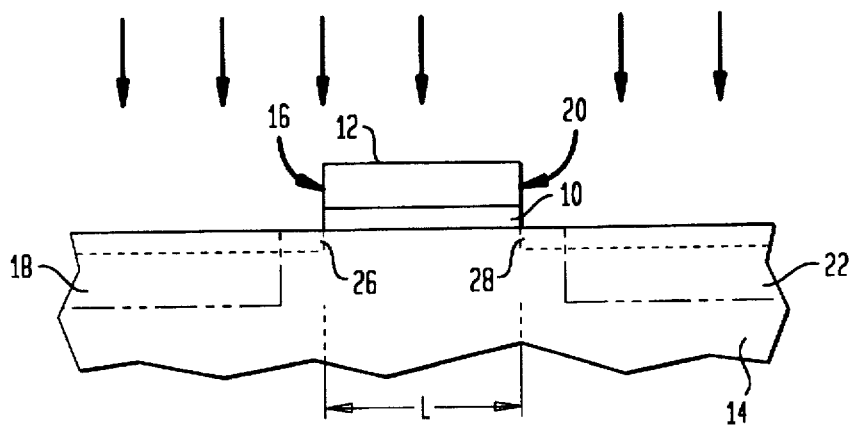
FIGS. 2–7 illustrate various process steps for making a field effect transistor (FET) device having an asymmetrical spacer formation in accordance with the method of the present invention.

Turning now to FIG. 2, a method of fabricating a field effect transistor (FET) having an asymmetrical spacer formation shall be described. The method includes forming a gate oxide 10 and a gate electrode 12 on a layer of semiconductor material 14. The gate oxide has a thickness on the order of 50–60 Å. The gate electrode has a thickness on the order of 2000 Å. Formation of the gate oxide and the gate electrode can be accomplished by techniques known in the art. The layer of semiconductor material 14 preferably includes silicon of a first conductivity type. The gate electrode 12 includes a first side edge 16 proximate a first region 18 of the semiconductor material 14. Gate electrode 12 further includes a second side edge 20 proximate a second region 22 of the semiconductor material 14. The channel length of the resultant FET device shall be approximately equal to the length "L" of the gate electrode 12.

Still referring to FIG. 2, ions of a second conductivity type are implanted in regions of the semiconductor material 14 not covered by the gate oxide 10. Note, however, that a small amount of residual gate oxide remains on the surface of the silicon subsequent to the polysilicon etch used for forming the gate electrode. The residual gate oxide does not interfere with the ion implantation. The ion implanted regions form first and second lightly doped regions 26 and 28, respectively, which penetrate into the substrate material by a small amount, on the order of 0.1 μm. The first and second lightly doped regions 26 and 28, respectively, extend at least between the first side edge 16 and the first region 18 and at least between the second side edge 20 and the second region 22, respectively.

Figure 3:
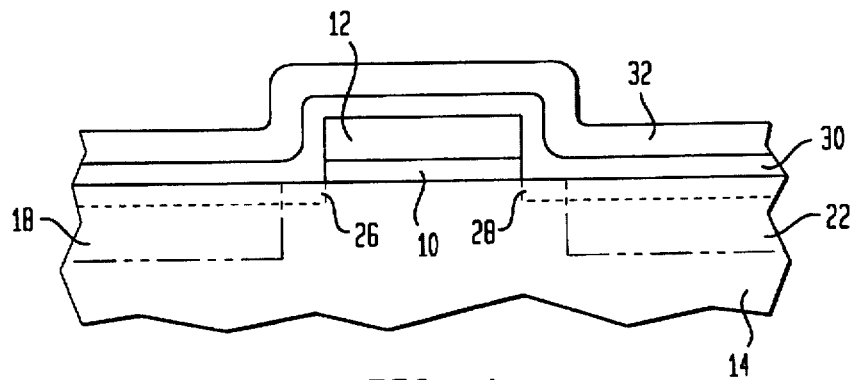

Subsequent to the ion implantation of FIG. 2, a first blanket layer of oxide 30 is formed on the gate electrode 12 and the layer of semiconductor material 14 (FIG. 3). Formation of the conformal blanket oxide layer 30 can be accomplished by deposition methods known in the art. Oxide layer 30 is preferably formed to a thickness on the order of 100 Å. After formation of the oxide 30, a blanket layer of nitride 32 having a thickness on the order of 300 to 700 Å, preferably 500 Å, is formed on the first oxide layer 30. Formation of the nitride layer 32 is accomplished by deposition techniques known in the art, including chemical vapor deposition (CVD), plasma CVD at low temperatures, or low pressure CVD (LPCVD) at high temperatures.

Figure 4:
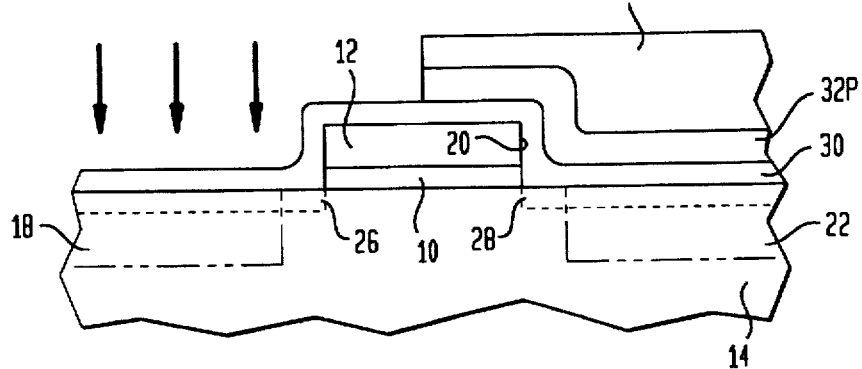

Turning now to FIG. 4, nitride layer 32 is patterned using any suitable photolithographic patterning technique known in the art, to remove the layer 32 in desired locations except at a third region extending partially over the gate electrode and the semiconductor material adjacent an edge of the gate electrode. That is, the nitride layer 32 is patterned using any suitable photoresist material 34, exposed and etched, as known in the art, to remove the nitride layer 32 except at a third region extending over the second side edge 20 of the gate electrode 12 and a portion of the semiconductor material 14 proximate the second side edge 20, as shown in FIG. 4. A remaining portion of the nitride layer 32P overlays the second side edge 20 and is separated from the gate electrode 12 and the semiconductor material 14 by the first oxide layer 30.

Figure 5:
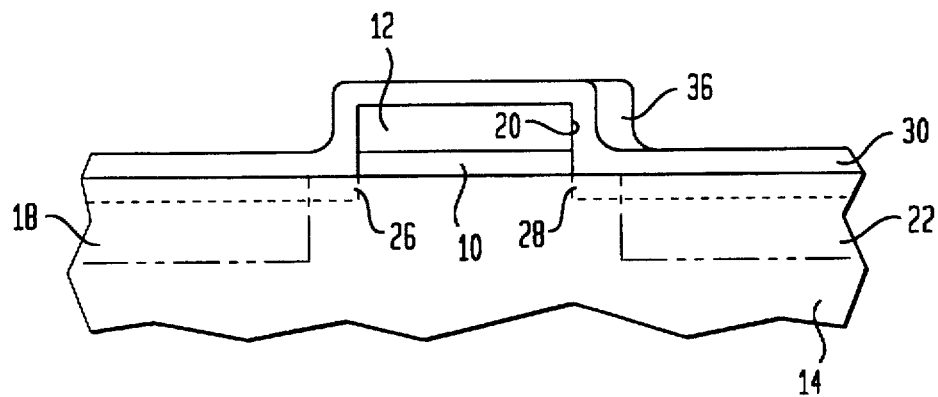
Figure 6:
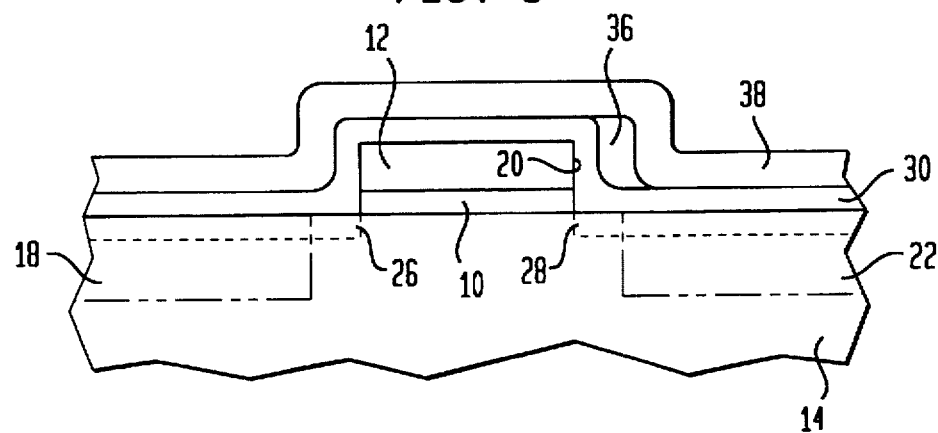

A first sidewall spacer 36 is then formed in the remaining portion 32P of the nitride layer proximate the second side edge 20 (FIG. 5). Formation of the first sidewall spacer 36 is accomplished by subjecting the existing structure to a directional etch, such as, Reactive Ion Etching or RIE. A second blanket layer of oxide 38 is thereafter formed on the first oxide layer 30 and the first sidewall spacer 36 (FIG. 6). The second oxide layer is a conformal layer formed or deposited upon the structure using techniques known in the art. The second oxide layer has a thickness on the order of 2000 Å±300 Å.

Figure 7:
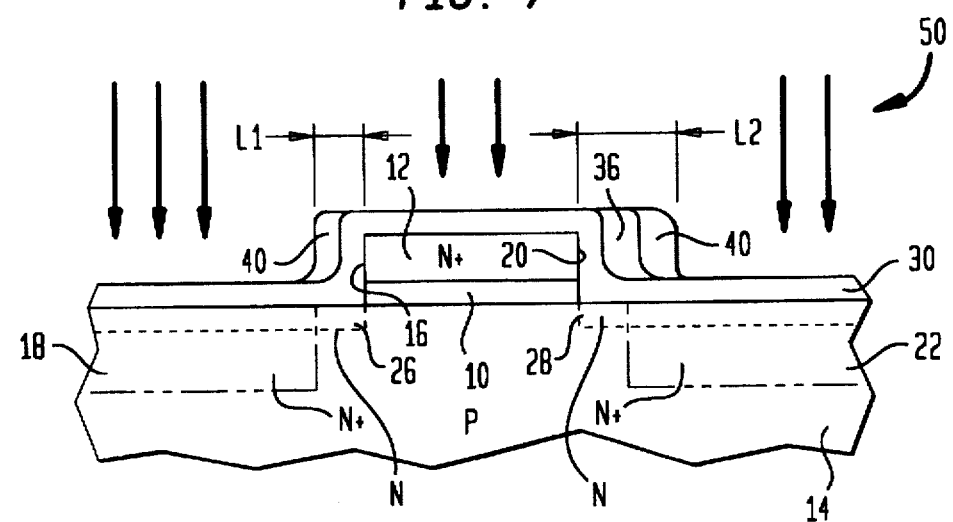

Second sidewall spacers 40 are then formed in the second oxide layer 38 using a directional etch, such as a RIE etch. A first one of the second sidewall spacers 40 includes oxide of a first effective lateral dimension of "L1" proximate the first side edge 16. A second one of the second sidewall spacers 40 is juxtaposed with the first sidewall spacer 36 to form a composite sidewall spacer of a second lateral dimension of "L2". The second lateral dimension L2 is greater than the first lateral dimension L1, as shown in FIG. 7.

The method in accordance with the present invention further includes, subsequent to the step of forming the second sidewall spacers 40, the step of silicidating a top surface of the semiconductor material in the first and second regions, 18 and 22, respectively, in addition to the gate electrode 12. In this instance, the first and second regions correspond to a source region and a drain region, respectively. Silicidation reduces the resistance of the contact areas of the transistor device.

Salicidation of the top surface of the semiconductor material and the gate electrode includes depositing a blanket layer of titanium upon the structure. The structure is then heated in a nitrogen ambient using, for example, a rapid thermal anneal (RTA) at 700° C. for about 30 seconds. Annealing may also be conducted using other suitable annealing techniques known in the art. During the anneal, the titanium reacts with the silicon on the top surface of the semiconductor material 14 and the top surface of the polysilicon gate, as follows. Titanium reacts with silicon (or polysilicon) in regions having less than about 150 Å of oxide between the titanium and the silicon (or polysilicon). Any oxide having a thickness greater than 150 Å positioned between the titanium and the silicon (or polysilicon) prevents silicidation from occurring. When the titanium reacts with silicon or polysilicon, titanium silicide (TiSi) is formed. In regions having oxide of a thickness greater than 150 Å positioned between the titanium and the silicon (or polysilicon), the titanium does not react with the silicon (or polysilicon) but with the nitrogen ambient to form TiN. It is thus desirable to have the oxide which is positioned between the titanium and the silicon to have a thickness less than or equal to about 150 Å.

Alternatively, the method in accordance with the present invention further includes, subsequent to the step of forming the second sidewall spacers 40, the step of selectively depositing metal on a top surface of the semiconductor material in the first and second regions, 18 and 22, respectively, and on the polysilicon gate electrode. The first and second regions correspond to a source region and a drain region, respectively, of the transistor device. The metal may comprise any suitable metal, such as, titanium or cobalt.

Still further, in another alternate embodiment in accordance with the present invention, the method further includes, subsequent to the step of forming second sidewall spacers 40, the step of implanting ions of a second conductivity type in the first and second regions 18 and 22, respectively, of the semiconductor material 14 and gate electrode 12. The ion concentration of the implant is on the order of 1–5e15 ions/cm². After implant, the structure is annealed for example, by RTA at a temperature of 1000°–1100° C. for a duration of 30–60 seconds. The anneal activates the implanted regions. The first and second regions 18 and 22 correspond to a highly doped source region and a highly doped drain region, respectively. The highly doped source and drain regions have a greater dopant concentration of the second conductivity type than the lightly doped regions 26 and 28, respectively.

Still further, in yet another alternate embodiment in accordance with the present invention, the method further includes, subsequent to the step of forming the first sidewall spacer 36, the step of implanting ions having a first ion concentration on the order of 1–5 e15 ions/cm² of the second conductivity type in the first region 18 of the semiconductor material 14. This implant step is then followed by a suitable anneal. In addition, subsequent to the step of forming the second sidewall spacers 40, the method further includes the step of implanting additional ions of the second conductivity type in the first region 18 and ions of the second conductivity type in the second region 22 of the semiconductor material 14. The ion concentration of this later step is on the order of 1–5 e15 ions/cm². Following this latest implant, the structure is again annealed for activating the dopant in the respective implanted regions. In this instance, the first region 18 corresponds to a source region having a first dopant concentration and the second region 22 corresponds to a drain region having a second dopant concentration. The first dopant concentration is greater than the second dopant concentration and the second dopant concentration is greater than the dopant concentration of the lightly doped regions 26 and 28.

Figure 8:
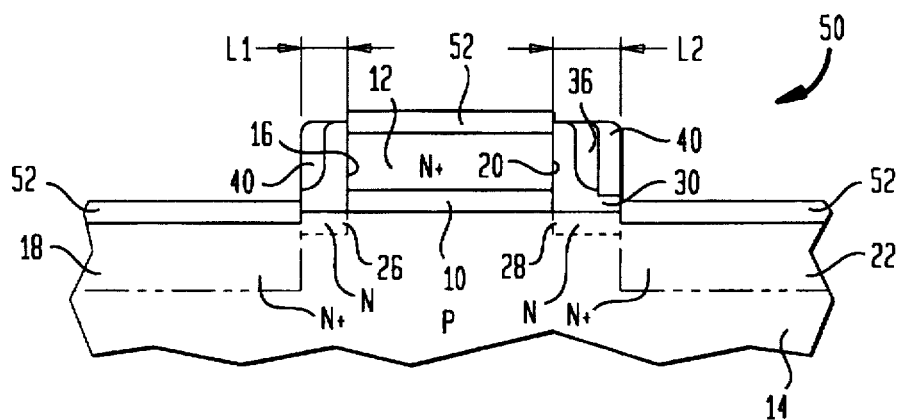
FIG. 8 illustrates an FET device having an asymmetrical spacer formation in accordance with the present invention.

The field effect transistor (FET) device 50 having an asymmetrical spacer formation in accordance with the present invention is shown in FIG. 8. A gate oxide 10 and a gate electrode 12 are formed on a layer of semiconductor material 14. Semiconductor material 14 is of a first conductivity type. The gate electrode 12 includes a first side edge 16 proximate a first region 18 of the semiconductor material 14. The gate electrode 12 further includes a second side edge 20 proximate a second region 22 of the semiconductor material 14.

Lightly doped regions 26 and 28 of a second conductivity type are formed in regions of the semiconductor material 14 not covered by the gate oxide 10. The lightly doped regions 26 and 28, respectively, extend at least between the first side edge 16 and the first region 18 and at least between the second side edge 20 and the second region 22, respectively.

A first blanket layer of oxide 30 is formed on the gate electrode 12 and the layer of semiconductor material 14. A first sidewall spacer of nitride 36 is formed proximate the second side edge 20 of the gate electrode 12. The first sidewall spacer 36 is formed by patterning of a blanket layer of nitride. After deposition of the blanket layer of nitride onto the gate electrode and the semiconductor material, the nitride layer is removed except at a third region, wherein the third region extends over the second side edge 20 of the gate electrode 12 and a portion of the semiconductor material 14 proximate the second side edge 20. A remaining portion of the nitride layer is thus left which overlays the second side edge 20 and is separated from the gate electrode 12 and the semiconductor material 14 by the oxide layer 30.

FET device 50 further includes second sidewall spacers 40. Second sidewall spacers 40 include spacers having been formed from a second blanket layer of oxide formed on the first oxide layer 30 and the first sidewall spacer 36. A first one of the second sidewall spacers includes oxide of a first lateral dimension "L1" proximate the first side edge 16 of the gate electrode 12. A second one of the second sidewall spacers is juxtaposed with the first sidewall spacer 36 to form a composite sidewall spacer of a second lateral dimension "L2" greater than the first lateral dimension "L1".

In accordance to an alternate embodiment of the present invention, FET device 50 further includes silicidated contact regions 52 in a top surface of the semiconductor material 14 in the first and second regions 18 and 22, respectively and on the top surface of gate electrode 12. In this instance, the first and second regions correspond to a source region and a drain region, respectively. Alternatively, FET device 50 further includes metal contact regions selectively deposited on a top surface of the semiconductor material 14 in the first and second regions 18 and 22, respectively, and on the top surface of the gate electrode 12. Still further, the first and second regions, 18 and 22, respectively, of FET device 50 correspond to a highly doped source region and a highly doped drain region, respectively. The highly doped source and drain regions have a greater dopant concentration of the second conductivity type than the lightly doped regions, 26 and 28, respectively.

Figure 9:
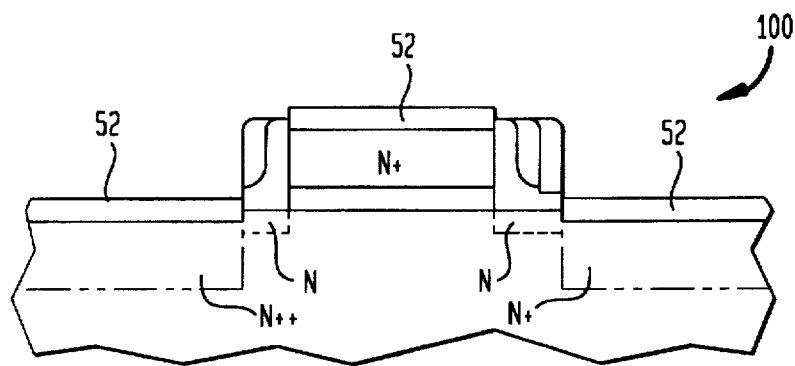
FIG. 9 illustrates an FET device having an asymmetrical spacer formation in accordance with an alternate embodiment of the present invention.

Referring now to FIG. 9, in accordance to yet another alternate embodiment of the present invention, the FET device 100 is similar to that previously described with the following differences. The first region 18 of FET device 100 corresponds to a source region having a first dopant concentration and the second region 22 corresponds to a drain region having a second dopant concentration, wherein the first dopant concentration is greater than the second dopant concentration, such as, by an order of magnitude. Lastly, the second dopant concentration is greater than the dopant concentration of the lightly doped regions 26 and 28.

Figure 10:
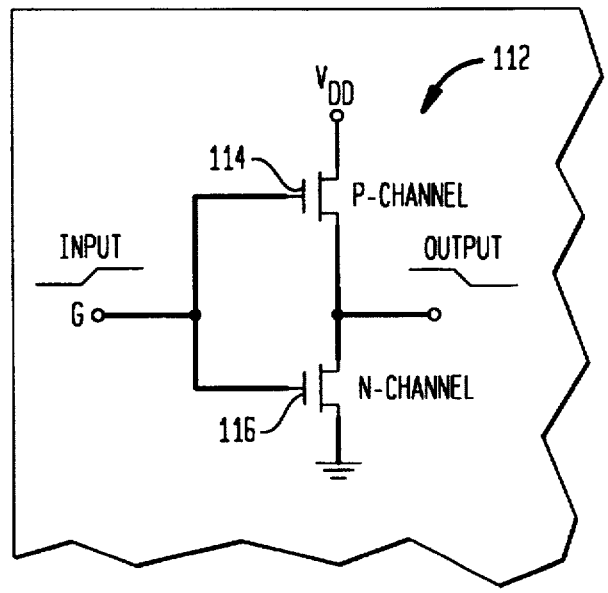
FIG. 10 illustrates an integrated circuit which includes an FET device in accordance with the present invention.

Turning now to FIG. 10, the present invention further includes a semiconductor integrated circuit 110 (for example, a microprocessor) having various circuit elements, such as an inverter 112, for implementing a particular circuit function. The integrated circuit 112 includes a field effect transistor (FET) as discussed herein above. For example, inverter 112 includes a p-channel FET 114 and an n-channel FET 116.

There has thus been shown a method of fabricating a field effect transistor (FET) and an FET device, itself, having an asymmetrical spacer formation, which provides an increased drive current capacity for the transistor. Specifically, the increase in drive current is on the order of 10–15% over the drive current of a typical MOSFET of symmetrical configuration having a similar channel length. The particular drive current achievable with the present invention is specific to the geometry of the transistor. Furthermore, the present invention provides a transistor with improved drive current while maintaining high device reliability.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of fabricating a field effect transistor (FET) having an asymmetrical spacer formation, said method comprising the steps of:

forming a gate oxide and a gate electrode on a layer of semiconductor material of a first conductivity type, said gate electrode having a first side edge proximate a first region of said semiconductor material and a second side edge proximate a second region of said semiconductor material;

implanting ions of a second conductivity type in regions of the semiconductor material not covered by said gate oxide for forming lightly doped regions, the lightly doped regions extending at least between the first side edge and the first region and at least between the second side edge and the second region, respectively;

forming a first blanket layer of oxide on said gate electrode and said layer of semiconductor material;

forming a first sidewall spacer of a first spacer material proximate the second side edge; and forming second sidewall spacers of a second spacer material, wherein a first one of said second sidewall spacers is of a first lateral dimension proximate the first side edge and wherein a second one of said second sidewall spacers is juxtaposed with the first sidewall spacer to form a composite sidewall spacer having a second lateral dimension greater than the first lateral dimension.

2. The method of claim 1, further comprising the step of:

subsequent to said step of forming said second sidewall spacers, silicidating a top surface of said semiconductor material in the first and second regions corresponding to a source region and a drain region, respectively.

3. The method of claim 1, further comprising the step of:

subsequent to said step of forming said second sidewall spacers, selectively depositing metal on a top surface of said semiconductor material in the first and second regions corresponding to a source region and a drain region, respectively.

4. The method of claim 1, further comprising the step of:

subsequent to said step of forming said second sidewall spacers, implanting ions of a second conductivity type in the first and second regions of said semiconductor material, wherein the first and second regions correspond to a highly doped source region and a highly doped drain region, respectively, the highly doped source and drain regions having a greater dopant concentration of the second conductivity type than the lightly doped regions.

5. The method of claim 1, further comprising the steps of:

subsequent to said step of forming said first sidewall spacer, implanting ions of the second conductivity type in the first region of said semiconductor material; and subsequent to said step of forming said second sidewall spacers, implanting additional ions of the second conductivity type in the first region and ions of the second conductivity type in the second region of said semiconductor material, wherein the first region corresponds to a source region having a first dopant concentration and the second region corresponds to a drain region having a second dopant concentration, wherein the first dopant concentration is greater than the second dopant concentration and the second dopant concentration is greater than the dopant concentration of the lightly doped regions.

6. The method of claim 1, wherein forming said first sidewall spacer includes forming a blanket layer of nitride on said first oxide layer, patterning the nitride layer to remove the nitride layer except at a third region extending over the second side edge of said gate electrode and a portion of said semiconductor material proximate the second side edge, a remaining portion of the nitride layer overlaying the second side edge and separated from said gate electrode and said semiconductor material by said first oxide layer, and directionally etching the remaining portion of the nitride layer proximate the second side edge, and forming said second sidewall spacers includes forming a second blanket layer of oxide on said first oxide layer and said first sidewall spacer, and directionally etching the second oxide layer.

7. The method of claim 6, further comprising the step of:

subsequent to said step of forming said second sidewall spacers, silicidating a top surface of said semiconductor material in the first and second regions corresponding to a source region and a drain region, respectively.

8. The method of claim 6, further comprising the step of:

subsequent to said step of forming said second sidewall spacers, selectively depositing metal on a top surface of said semiconductor material in the first and second regions corresponding to a source region and a drain region, respectively.

9. The method of claim 6, further comprising the step of:

subsequent to said step of forming said second sidewall spacers, implanting ions of a second conductivity type in the first and second regions of said semiconductor material, wherein the first and second regions correspond to a highly doped source region and a highly doped drain region, respectively, the highly doped source and drain regions having a greater dopant concentration of the second conductivity type than the lightly doped regions.

10. The method of claim 6, further comprising the steps of:

subsequent to said step of forming said first sidewall spacer, implanting ions of the second conductivity type in the first region of said semiconductor material; and subsequent to said step of forming said second sidewall spacers, implanting additional ions of the second conductivity type in the first region and ions of the second conductivity type in the second region of said semiconductor material, wherein the first region corresponds to a source region having a first dopant concentration and the second region corresponds to a drain region having a second dopant concentration, wherein the first dopant concentration is greater than the second dopant concentration and the second dopant concentration is greater than the dopant concentration of the lightly doped regions.

* * * * *

UNITED STATES PATENT AND TRADEMARK OFFICE
CERTIFICATE OF CORRECTION

PATENT NO. : 5,789,298
DATED : August 4, 1998
INVENTOR(S) : Gardner, et. al.

It is certified that error appears in the above-indentified patent and that said Letters Patent is hereby corrected as shown below:

Column 1, lines 19-20    Replace "MOS-PET"
                                With --MOSFET--

Signed and Sealed this

Twentieth Day of March, 2001

Attest:

NICHOLAS P. GODICI

*Attesting Officer*      *Acting Director of the United States Patent and Trademark Office*